United States Patent [19]

Huang

[11] Patent Number: 5,226,007
[45] Date of Patent: Jul. 6, 1993

[54] AUTOMATIC SHUTOFF FOR MEMORY LOAD DEVICE DURING WRITE OPERATION

[75] Inventor: Eddy C. Huang, San Jose, Calif.

[73] Assignee: VLSI Technology, Inc., San Jose, Calif.

[21] Appl. No.: 744,780

[22] Filed: Aug. 14, 1991

[51] Int. Cl.$^5$ .............................................. G11C 7/00
[52] U.S. Cl. .......................... 365/189.01; 365/189.08; 365/227
[58] Field of Search ....................... 365/189.01, 189.06, 365/189.11, 227, 190, 189.08, 181, 203; 307/451

[56] References Cited

U.S. PATENT DOCUMENTS

| 4,665,507 | 5/1987 | Gondou et al. | 365/227 |
| 4,933,905 | 6/1990 | Ootani | 365/190 |

FOREIGN PATENT DOCUMENTS

| 57-27489 | 2/1982 | Japan | 365/203 |
| 58-01883 | 1/1983 | Japan | 365/227 |
| 60-224186 | 11/1985 | Japan | 365/227 |

Primary Examiner—Eugene R. LaRoche
Assistant Examiner—Andrew Tran
Attorney, Agent, or Firm—Burns, Doane, Swecker & Mathis

[57] ABSTRACT

The present invention is directed to semiconductor memories which can operate at faster speeds with reduced power dissipation. In a preferred embodiment, load devices of a memory array, such as a SRAM, are automatically turned off during a write operation in response to detected bit line activity. Accordingly, considerable power is saved while minimizing memory architecture and the potential for power surges during a write enable.

19 Claims, 1 Drawing Sheet

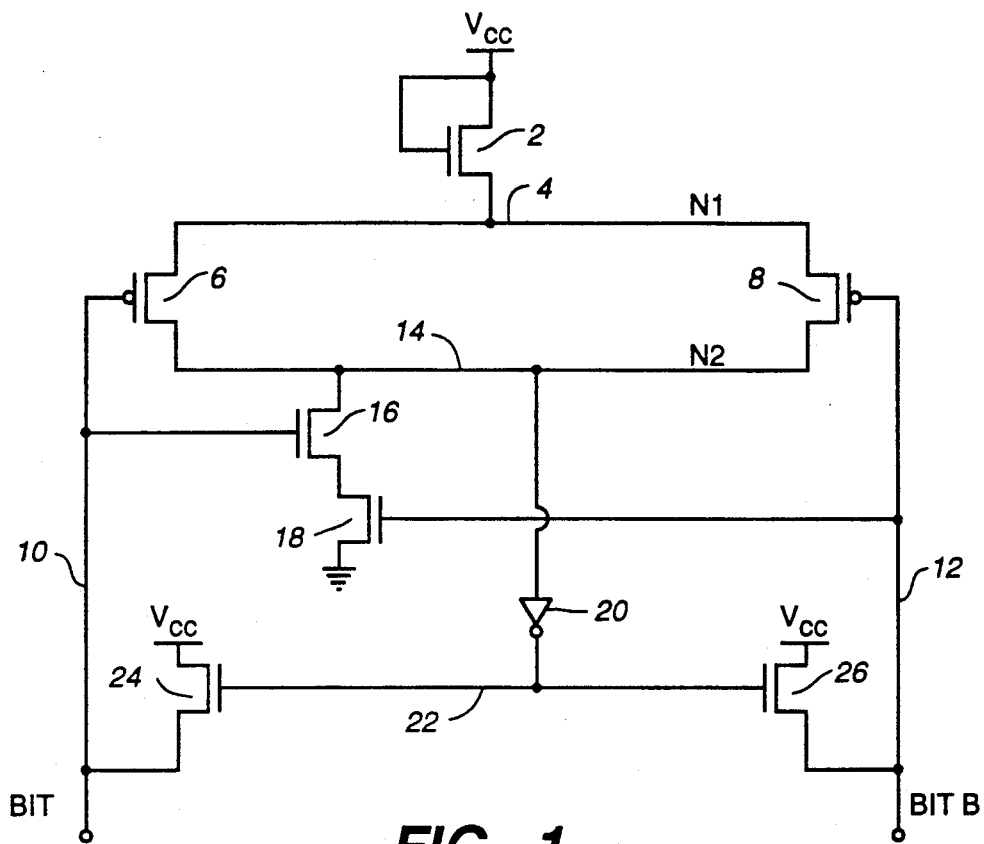
FIG._1
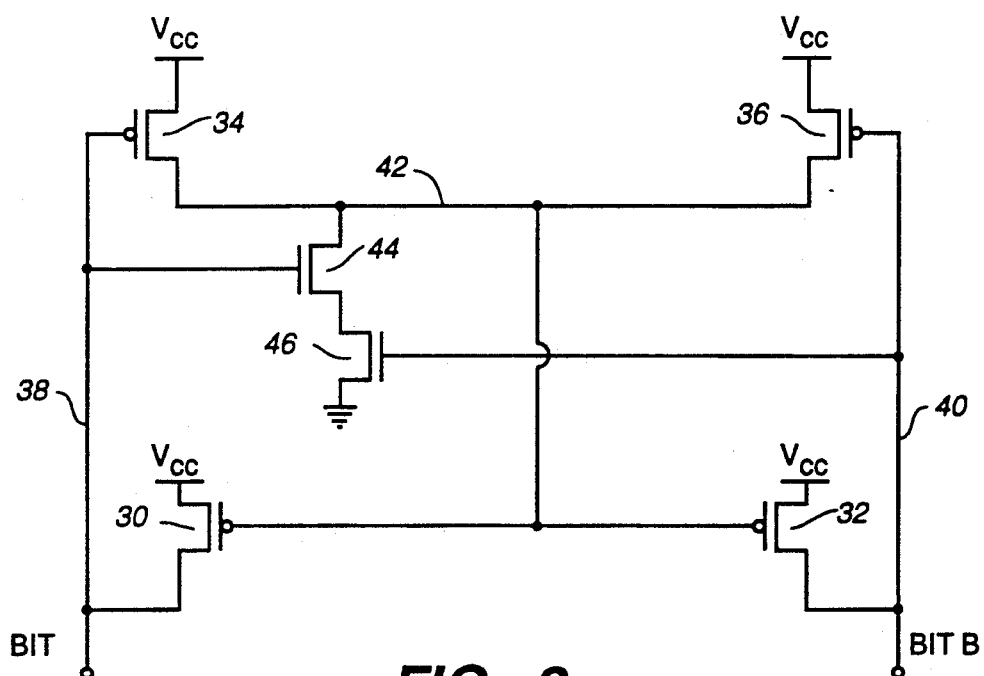
FIG._2

AUTOMATIC SHUTOFF FOR MEMORY LOAD DEVICE DURING WRITE OPERATION

BACKGROUND OF THE INVENTION

1. Field of the Invention

The present invention relates generally to the design of semiconductor memories and, more particularly, to memories (e.g., static random access memories, or SRAMs) having load devices for enhancing read time.

2. State of the Art

Semiconductor memories, such as SRAMs, typically include an orthogonal array of memory cells arranged in columns and rows for storing data as binary ones and zeros. Data can be written into or read from an addressed memory cell via write and read enable signals, respectively.

Typically, a particular memory cell is addressed by a word select line which includes a column address and a row address. A memory cell located at the intersection of the selected column and row can thus be identified such that binary data may be written into the cell or read out of the cell via bit lines during a write or read operation, respectively.

Two bit lines are associated with each column of an SRAM. Both bit lines are maintained at a given logic level (e.g., logic level high) when data is neither being written into or read from the column of cells.

One of the bit lines is used to represent a logic low condition of an addressed cell in the column, and the other bit line is used to represent a logic high condition of the addressed cell. When a given cell is addressed and enabled during a read operation, the bit line associated with a currently stored logic condition of the cell is pulled low. When the cell is addressed and enabled during a write operation, one of the two bit lines is externally pulled low (i.e., close to ground) to write a logic high or low into the cell.

For example, during a read operation the condition of a memory cell (e.g., logic level high or low) will cause one or the other of the bit lines to drop in voltage level relative to the other bit line. If a stored logic level low causes the first bit line to drop in voltage relative to the second bit line, a stored logic level high would cause the second bit line to drop in voltage relative to the first bit line. During a write operation, an external device (e.g., transistor and/or resistor) is used to pull one of the bit lines low to write a zero or one into the cell.

The speed with which data can be written into or read from a memory cell depends in part on how rapidly the logic levels on the bit lines can change. If a bit line has a low logic level after reading data from a first memory cell, the bit line may transition to a high logic level on reading data from the next sequential memory cell in the column. Significant time is required for the bit line to accommodate this transition in logic levels, thereby limiting the SRAM's operating speed.

It is for this reason that each bit line in a typical SRAM includes a load device with the voltage supply. In known SRAMs, an n-channel or p-channel FET is commonly used as the load device. Gates of the load devices are typically connected to a voltage level representing a logic high level for n-channel load devices or to a logic low level for p-channel load devices.

During a read operation, the load device prevents the bit line voltage with which it is associated from changing significantly. The logic condition of the memory cell is then determined by amplifying the difference between voltage levels on the two bit lines. Accordingly, the time required for recharging the bit lines before reading a subsequent memory cell is decreased such that operating speed of the SRAM is increased.

Although the use of load devices enhances operating speed, it poses several significant drawbacks. Key among these are the operating power requirements associated with the use of load devices. Because load devices prevent the bit lines from traversing the full range of voltage levels associated with logic level low and high conditions during read operations, writing into the cells is rendered more difficult. The added impedance of a load device increases the power requirements necessary to effect writing of logic level lows and highs into the memory cells. The continuously operative load device makes it difficult to pull a bit line low enough to ground to effectively write information into the cell.

Accordingly, larger devices (e.g., transistors more powerful than the load devices) are typically provided to pull the appropriate bit line close to ground during a write operation. Such an arrangement results in substantial current dissipation from the load device. This current becomes significantly higher when the number of cells concurrently written into is increased.

More recent efforts have therefore focused on disabling the load devices during a write operation. For example, known memory devices use an inverted write enable signal to gate the load device or devices. The gates of transistors used as the load devices in each column are tied to the write enable signal through an invertor. If an active high write enable signal initiates a write operation, the inverted write enable deactivates the load devices.

Although the use of an inverted write enable signal to deactivate the load devices avoids significant current dissipation during the write operation, this approach also suffers significant drawbacks. For example, the inverted write enable signal must be routed throughout the entire memory array (i.e., to every bit line) to disable all load devices. This increases the complexity of the memory array architecture as well as the capacitance and power requirements of the write enable signal. Further, the large number of conductive paths associated with the write enable signal produces power surges in these paths each time a write enable is activated or deactivated. These power surges can detrimentally affect overall circuit operation (e.g., disturb the power supply line of the memory).

Accordingly, it would be desirable to provide a memory array architecture which avoids the significant power requirements associated with the use of bit line load devices without suffering the aforementioned drawbacks.

SUMMARY OF THE INVENTION

The present invention is directed to the design of memories which can operate at faster speeds with reduced power dissipation during a write enable. In a preferred embodiment, load devices of a memory array (e.g., SRAM) are automatically turned off during a write operation in response to detected bit line activity. Accordingly, considerable power is saved without routing a write enable signal to all load devices. Further, complexity of the memory array architecture is simplified and disturbances due to current surges in the write enable signal path are minimized.

BRIEF DESCRIPTION OF THE DRAWINGS

Other objects and advantages of the present invention will be more apparent from the following detailed description of preferred embodiments when read in conjunction with the accompanying drawings, wherein:

FIG. 1 is a diagram showing a preferred of a SRAM using n-channel load transistors; and FIG. 2 is a diagram showing another preferred embodiment using p-channel load transistors.

DETAILED DESCRIPTION OF THE PREFERRED EMBODIMENTS

In a preferred embodiment, the invention relates to a load device for a memory array having at least one cell for storing information. The load device comprises means for loading a bit line associated with at least one memory cell, and means for detecting a condition of said bit line. The detecting means further includes means for deactivating said loading means in response to said detected condition.

FIG. 1 shows a preferred embodiment of a load device for a bit line 10 and a bit B line 12 in a given column of a memory array, such as a SRAM. A power supply for the bit lines shown includes a voltage $V_{cc}$. The voltage $V_{cc}$ is connected with a means for loading the bit lines and with a means for detecting a condition of the bit lines.

The FIG. 1 loading means includes first and second load transistors, represented as n-channel FETs 24 and 26. The gates of the load transistors 24 and 26 are tied together at a node 22, labelled N3. The drain of load transistor 24 and the drain of load transistor 26 are connected to the power supply $V_{cc}$. The source of load transistor 24 is connected to the bit line 10 while the source of load transistor 26 is connected to the bit B line 12. Load transistors 24 and 26 therefore act as load resistances biased by the supply voltage $V_{cc}$. When gated on, the load transistors place the bit and bit B lines at value of $V_{cc}-V_{TH}$ (i.e., 5 volts minus the respective gate to source threshold voltage of 1 volt).

The FIG. 1 means for detecting a condition of the bit lines includes four switching transistors 6, 8, 16 and 18. These transistors control the loading means. In an exemplary embodiment, switching transistors 6 and 8 are p-channel FETs and switching transistors 16 and 18 are n-channel FETs.

The drain of switching transistor 16 is connected to a second node 14, labelled N2. The gate of transistor 16 is connected to the bit line 10 and the source of transistor 16 is connected to the drain of switching transistor 18. The gate of transistor 18 is connected to the bit B line 12 and the source of transistor 18 is connected to ground. An invertor 20 is connected between node 14 and node 22.

The gate of switching transistor 6 is connected to the bit line 10. The gate of switching transistor 8 is connected to the bit B line 12. The sources of transistors 6 and 8 are tied to the node 14 and their drains are tied together at a node 4, labelled N1. The node 4 is connected to the power supply $V_{cc}$ via an n-channel FET shown as transistor 2. The transistor 2 prevents node 4 from being pulled above a value of $V_{cc}-V_{TH}$ (i.e., 5 volts minus the 1 volt gate to source threshold value of the transistor 2).

By setting the node 4 voltage to $V_{cc}-V_{TH}$ (i.e., the same as the bit and bit B lines), p-channel transistors 6 and 8 are biased off when load transistors 24 and 26 are gated on. The $V_{TH}$ drop of transistor 2 keeps the p-channel transistors 6 and 8 biased off until a voltage differential significantly greater than $V_{cc}-V_{TH}$ occurs on the bit lines. The term "significantly" refers to a voltage differential greater than that which occurs on the bit lines during the reading of a cell, so that the load transistors will only be switched off during write operations.

During a read operation, the load transistors 24 and 26 are gated on. However, the voltage differential developed between the bit lines for a read operation is significantly less than $V_{TH}$ of the p-channel transistors 6 and 8. For example, the voltage differential between bit lines 10 and 12 used to read data from a memory cell can be 100 to 200 mV. Transistors 6 and 8 are therefore kept off while transistors 16 and 18 are turned on to pull node 14 to ground. Further, the output of invertor 20 is maintained at a logic level high to keep the load transistors 24 and 26 on during read operations.

During a write operation either the bit line 10 or the bit B line 12 is pulled close to ground by an external device (e.g., transistor or resistor tied to the bit line). The voltage drop on bit line 10 or 12 during a write operation is sufficient to gate on either the switching transistor 6 or 8 (e.g., voltage of approximately $V_{cc}-(2V_{TH})$ to overcome the $V_{TH}$ of transistor 2). Depending on whether bit line 10 or bit B line 12 has been pulled low during the write operation, one of the n-channel transistors 16 or 18 will also be gated off. By gating one of transistor 6 or 8 on and one of transistor 16 or 18 off, nodes 4 and 14 are maintained at a logic level high value of $V_{cc}-V_{TH}$, such that node 22 (i.e., the output of the invertor 20) remains low and the load transistors remain off.

Upon completion of the write operation, the bit lines 10 and 12 are pulled high for write recovery. Transistors 6 and 8 are thereby turned off and transistors 16 and 18 are turned on. With transistors 16 and 18 gated on and transistors 6 and 8 off, a ground path is provided for the sources of transistors 6 and 8, thus maintaining node 14 at a low logic level. Node 22 therefore returns to a logic level high state. The load transistors 24 and 26 are again turned on and are ready for subsequent operation.

Because one of the bit line 10 and bit B line 12 will always transition to a logic level low when writing into the column associated with these bit lines, node 14 will always be pulled high and node 22 will always be driven low during the write operation. Thus, it can be assured that the main load devices represented as load transistors 24 and 26 will automatically be turned off during a write operation.

An alternate embodiment of the invention will now be described with respect to FIG. 2. In FIG. 2, the n-channel load transistors 24 and 26 have been replaced with p-channel load transistors 30 and 32. Because p-channel devices have a negligible $V_{TH}$, the biasing point for the bit and bit-B lines is close to $V_{cc}$ (i.e., p-channel load devices can raise the voltage level at their drains to approximately $V_{cc}$). Thus, the FIG. 1 transistor 2 has been eliminated in FIG. 2.

The detecting means of FIG. 2 includes four switching transistors 34, 36, 44 and 46. The switching transistors 34 and 36 are p-channel FETs connected via their gates to a bit line 38 and a bit B line 40, respectively. Drains of the switching transistors 34 and 36 are connected to a voltage source $V_{cc}$. Sources of both switching transistors 34 and 36 are commonly connected via a node 42 to the drain of transistor 44. The source of transistor 44 is serially connected with the drain of transistor 46. Transistors 44 and 46 are, for example, n-channel FETs. The source of transistor 46 is connected to ground, while gates of the transistors 44 and 46 are connected to bit line 38 and bit B line 40, respectively.

The sources of load transistors 30 and 32 are connected to the bit lines 38 and 40, respectively, while the drains of these transistors are connected to the voltage supply $V_{cc}$. Commonly connected gates of the load transistors are connected with node 42 via line 48.

Operation of the FIG. 2 circuit is similar to that of FIG. 1. When the bit and bit B lines 38, 40 are logic level high or drop only by a slight amount necessary to read a logic condition from a given cell in the column, n-channel switching transistors 44 and 46 remain on and p-channel switching transistors 34 and 36 remain off. Thus, node 42 is maintained logic level low as are the gates of load transistors 30 and 32 via the connection 48. The logic level low at the gates of the p-channel load transistors 30 and 32 maintains these transistors in an on condition during a read operation.

However, when one of either bit line 38 or bit B line 40 is pulled close to ground during a write operation, either transistor 34 or transistor 36 is turned on. Further, transistors 44 and 46 are turned off if either bit line 38 or bit B line 40 is pulled below $V_{cc}-V_{TH}$, where $V_{TH}$ is the gate threshold voltage of n-channel FET 44 or 46. Node 42 is thereby placed at a logic level high. Further, load transistors 30 and 32 are turned off via connection 48 such that no load current flows through their sources.

Upon completion of a write operation, both bit line 38 and bit B line 40 are again pulled to a logic level high for write recovery. Node 42 is therefore reset to a logic level low to turn on load transistors 30 and 32. As with the FIG. 1 embodiment, normal voltage variations on the bit line 38 or bit B line 40 during a read operation are insufficient to turn on switching transistors 34 and 36 and turn off switching transistors 44 and 46.

While the invention has been described in its preferred embodiments, it is to be understood that the words that have been used are words of description rather than limitation and that changes within the purview of the appended claims may be made without departing from the true scope and spirit of the invention in its broader aspects.

What is claimed is:

1. A load device for a memory array having at least one cell for storing information, comprising:
    means for loading a bit line associated with at least one memory cell;
    means for detecting a condition of said bit line, said detecting means further including means for deactivating said loading means in response to said detected condition.

2. Device according to claim 1, wherein said loading means is a transistor.

3. Device according to claim 2, wherein said detecting means shuts off said transistor in response to said detected condition.

4. Device according to claim 3, wherein said detected condition is a drop in a voltage level of said bit line from a first level.

5. Device according to claim 4, wherein said drop in voltage level exceeds a voltage level drop on the bit line which occurs during a read operation.

6. Device according to claim 4, wherein said loading means is reactivated in response to said voltage level returning to said first level.

7. Device according to claim 1, wherein said detecting means deactivates said loading means during a write condition.

8. Device according to claim 1, wherein said detecting means reactivates said loading device during a read operation.

9. Device according to claim 1, wherein said loading means includes an n-channel FET.

10. Device according to claim 1, wherein said loading means includes a p-channel FET.

11. A load device for a memory array having at least one cell for storing information, comprising:
    means for loading a bit line associated with at least one memory cell, said loading means including a first FET transistor having a source connected to said bit line;
    means for detecting a condition of said bit line, said detecting means further including a second FET transistor having a gate connected to said bit line and a source connected to a gate of said first FET transistor for deactivating said loading means in response to said detected condition.

12. Device according to claim 11, wherein said first FET transistor is an n-channel FET, said second transistor is a p-channel FET, and the source of said second transistor is connected to the gate of said first transistor via an invertor.

13. Device according to claim 12, wherein said detecting means further includes a third transistor having a gate connected to said bit line, a source connected to ground, and a drain connected to the source of said second transistor to maintain said first transistor off during a write operation.

14. Device according to claim 11, wherein said memory array includes two bit lines for each memory cell with the source of said first FET transistor being connected to a first of said two bit lines and the gate of said first FET transistor being connected to the gate of a second load transistor, a source of said second load transistor being connected to a second of said two bit lines.

15. Device according to claim 11, wherein said memory array is a SRAM.

16. Device according to claim 11, wherein said first and second FET transistors are p-channel FETs, and the source of said second transistor is connected to the gate of said first transistor.

17. Device according to claim 16, wherein said detecting means further includes an n-channel FET having a gate connected to said bit line, a source connected to ground, and a drain connected to the source of said second transistor to maintain said first transistor off during a write operation.

18. Method for writing information into a cell of a memory array comprising the steps of:
    detecting a condition of a bit line used to write information into said cell;
    deactivating a load device of said bit line in response to said detected condition;
    reactivating said load device upon completion of a write operation.

19. Method according to claim 18, wherein said detected condition is a drop in voltage below that which occurs when said information is read from said cell.

* * * * *